United States Patent
Ting et al.

(10) Patent No.: US 11,025,054 B2
(45) Date of Patent: Jun. 1, 2021

(54) ELECTROSTATIC DISCHARGE PROTECTION DEVICE

(71) Applicant: eMemory Technology Inc., Hsinchu (TW)

(72) Inventors: Yun-Jen Ting, Hsinchu County (TW);
Chih-Wei Lai, Hsinchu County (TW);
Yi-Han Wu, Hsinchu County (TW);
Kun-Hsin Lin, Hsinchu County (TW);
Hsin-Kun Hsu, Hsinchu County (TW)

(73) Assignee: eMemory Technology Inc., Hsinchu (TW)

( * ) Notice: Subject to any disclaimer, the term of this patent is extended or adjusted under 35 U.S.C. 154(b) by 134 days.

(21) Appl. No.: 16/362,705

(22) Filed: Mar. 25, 2019

(65) Prior Publication Data

US 2019/0326750 A1    Oct. 24, 2019

Related U.S. Application Data

(60) Provisional application No. 62/659,150, filed on Apr. 18, 2018.

(30) Foreign Application Priority Data

Jan. 15, 2019  (TW) .................................. 108101557

(51) Int. Cl.
*H02H 9/04* (2006.01)
*H01L 27/02* (2006.01)

(52) U.S. Cl.
CPC .......... *H02H 9/046* (2013.01); *H01L 27/0248* (2013.01)

(58) Field of Classification Search
CPC ............................ H02H 9/046; H01L 27/0248
USPC ........................................................ 361/54–56
See application file for complete search history.

(56) References Cited

U.S. PATENT DOCUMENTS

| | | | | |
|---|---|---|---|---|
| 2008/0316660 | A1* | 12/2008 | Huang | H02H 9/046 361/56 |
| 2009/0168280 | A1* | 7/2009 | Huang | H02H 9/046 361/56 |
| 2017/0194317 | A1* | 7/2017 | Wallis | H01L 24/32 |
| 2019/0128939 | A1* | 5/2019 | O'Donnell | G01R 31/002 |
| 2019/0190256 | A1* | 6/2019 | Agarwal | H02H 1/0007 |

FOREIGN PATENT DOCUMENTS

| | | |
|---|---|---|
| TW | 201037816 | 10/2010 |
| TW | 201141059 | 11/2011 |
| TW | 201315075 | 4/2013 |

* cited by examiner

*Primary Examiner* — Yemane Mehari
(74) *Attorney, Agent, or Firm* — JCIPRNET

(57) ABSTRACT

An electrostatic discharge protection device is provided. A voltage selection circuit selects a voltage having a higher voltage value among a reference voltage and a voltage on a conductive path and supply the selected voltage to a RC latch self-feedback circuit, so that the RC latch self-feedback circuit ties a voltage of an input end of a RC control circuit when the electrostatic discharge does not occur, and disconnect a switch that conducts an electrostatic current.

11 Claims, 5 Drawing Sheets

ELECTROSTATIC DISCHARGE PROTECTION DEVICE

CROSS-REFERENCE TO RELATED APPLICATION

This application claims the priority benefit of U.S. provisional application Ser. No. 62/659,150, filed on Apr. 18, 2018, and Taiwan application serial no. 108101557, filed on Jan. 15, 2019. The entirety of each of the above-mentioned patent applications is hereby incorporated by reference herein and made a part of this specification.

BACKGROUND

Field of the Invention

The invention relates to an electronic device and more particularly, to an electrostatic discharge protection device.

Description of Related Art

Electronic products may probably be affected by electrostatic discharge (ESD) in actual use environments and cause damage. Since an ESD voltage is much larger than a normally supplied power voltage, the electrostatic current is likely to damage the components when the electrostatic discharge occurs. Therefore, some protection measures have to be taken in circuits to effectively isolate the electrostatic current, so as prevent the elements from being burnt down.

A common method is to design an electrostatic discharge protection device between a core circuit and a pad to protect the circuits inside. In a conventional electrostatic discharge protection device, the pad may be used as a test input terminal for the ESD when the electrostatic discharge occurs and used as a power supply pad during a normal operation. However, in considerations of saving cost, satisfying a demand for reducing a circuit area, etc., there is a need to use the pad as an input/output (I/O) pad. Thus, how to use the pad as the power supply pad and the I/O pad, without having the transmission quality of data signals being affected by the circuit design, is a problem to be solved.

SUMMARY

The invention provides an electrostatic discharge protection device for a pad to be used as a power supply pad or an input/output (I/O) pad when the electrostatic discharge does not occur, so as to achieve advantages of saving cost and satisfying a demand for reducing a circuit area, without poor transmission quality of the data signals.

An electrostatic discharge protection device of the invention includes an electrostatic discharge switch circuit, a voltage selection circuit, a resistance-capacitance (RC) control circuit and an RC latch self-feedback circuit. The electrostatic discharge switch circuit is coupled between a first conductive path and a second conductive path, the first conductive path is coupled to a pad, and an electrostatic current is conducted between the first conductive path and the second conductive path when the electrostatic discharge occurs. An input terminal of the voltage selection circuit is coupled to the first conductive path and selects a voltage having a higher voltage value from a reference voltage and a voltage on the first conductive path to serve it as a selected output voltage. The RC control circuit is coupled to an output terminal of the voltage selection circuit, the second conductive path and the electrostatic discharge switch circuit, and supplies a bias voltage to a control terminal of the electrostatic discharge switch circuit in response to an electrostatic current on the first conductive path when the electrostatic discharge occurs, so as to turn on a discharge path of the electrostatic discharge switch circuit. The RC latch self-feedback circuit is coupled to the output terminal of the voltage selection circuit and the RC control circuit, and generates a control signal to the RC control circuit according to the selected output voltage and a feedback signal provided by an output terminal of the RC control circuit when the electrostatic discharge does not occur, so as to latch a voltage of an input terminal of the RC control circuit and disconnect the discharge path of the electrostatic discharge switch circuit.

In an embodiment of the invention, the RC latch self-feedback circuit includes a switch coupled between the voltage selection circuit and the RC control circuit, and a control terminal of the switch is coupled to the output terminal of the RC control circuit to receive the feedback signal.

In an embodiment of the invention, the electrostatic discharge switch circuit includes an N-type metal oxide semiconductor (NMOS) transistor, and the switch includes a P-type metal oxide semiconductor (PMOS) transistor.

In an embodiment of the invention, a source terminal and a base terminal of the NMOS transistor are coupled to each other.

In an embodiment of the invention, the electrostatic discharge switch circuit includes a PMOS transistor, and the switch includes a PMOS transistor.

In an embodiment of the invention, a source terminal and a base terminal of the PMOS transistor included in the electrostatic discharge switch circuit are coupled to each other.

In an embodiment of the invention, the voltage selection circuit includes a first PMOS transistor and a second PMOS transistor. A source terminal of the first PMOS transistor is coupled to the reference voltage, a gate terminal of the first PMOS transistor is coupled to the first conductive path, and a drain terminal and a base terminal of the first PMOS transistor are coupled to each other. A source terminal and a gate terminal of the second PMOS transistor are respectively coupled to the gate terminal and the source terminal of the first PMOS transistor, and a drain terminal of the second PMOS transistor in common with the drain terminal of the first PMOS transistor are coupled to the output terminal of the voltage selection circuit.

In an embodiment of the invention, the RC control circuit includes an inverter circuit, a resistor and a capacitor. An input terminal and an output terminal of the inverter circuit are respectively coupled to an output terminal and an input terminal of the RC latch self-feedback circuit to provide the feedback signal. A first terminal of the resistor is coupled to the output terminal of the voltage selection circuit, and a second terminal of the resistor is coupled to the input terminal of the inverter circuit. A first terminal of the capacitor is coupled to the second terminal of the resistor, and a second terminal of the capacitor is coupled to the second conductive path.

In an embodiment of the invention, the electrostatic discharge protection device further includes an electrostatic discharge avoidance circuit coupled between the first conductive path and a core circuit, is coupled to the output terminal of the RC control circuit and is controlled by the bias voltage to disconnect the first conductive path from the core circuit when the electrostatic discharge occurs.

In an embodiment of the invention, the first conductive path is a system voltage rail.

In an embodiment of the invention, the second conductive path is a ground voltage rail.

Based on the above, in the embodiments of the invention, the voltage selection circuit selects the voltage having the higher voltage value from the reference voltage and the voltage on the first conductive path, and supplies it to the RC latch self-feedback circuit. Thereby, the RC latch self-feedback circuit can latch the voltage of the input terminal of the RC control circuit when the electrostatic discharge does not occur, so as to disconnect the electrostatic discharge switch circuit to reduce power loss and prevent signal loss. Thus, the pad of the electrostatic discharge protection device can be used as the power supply pad or the I/O pad when the electrostatic discharge does not occur, so as to achieve advantages of saving cost, satisfying a demand for reducing the circuit area, etc., without incurring excessively high power loss and poor transmission of data signals.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Several embodiments are provided in the following of the disclosure. However, the disclosure shall not be limited to the embodiments exemplified herein. In addition, the embodiments may be properly combined with each other. Throughout the text of the disclosure (including claims), the term "couple" may refer to any direct or indirect connection means. For example, if it is described that a first device is coupled to a second device, it shall be interpreted that the first device may be directly connected to the second device, or the first device may be indirectly connected to the second device via another device or a connection means. Besides, the term "signal" may refer to at least one current, voltage, charge, temperature, data, or any other one or more signals.

Figure 1:
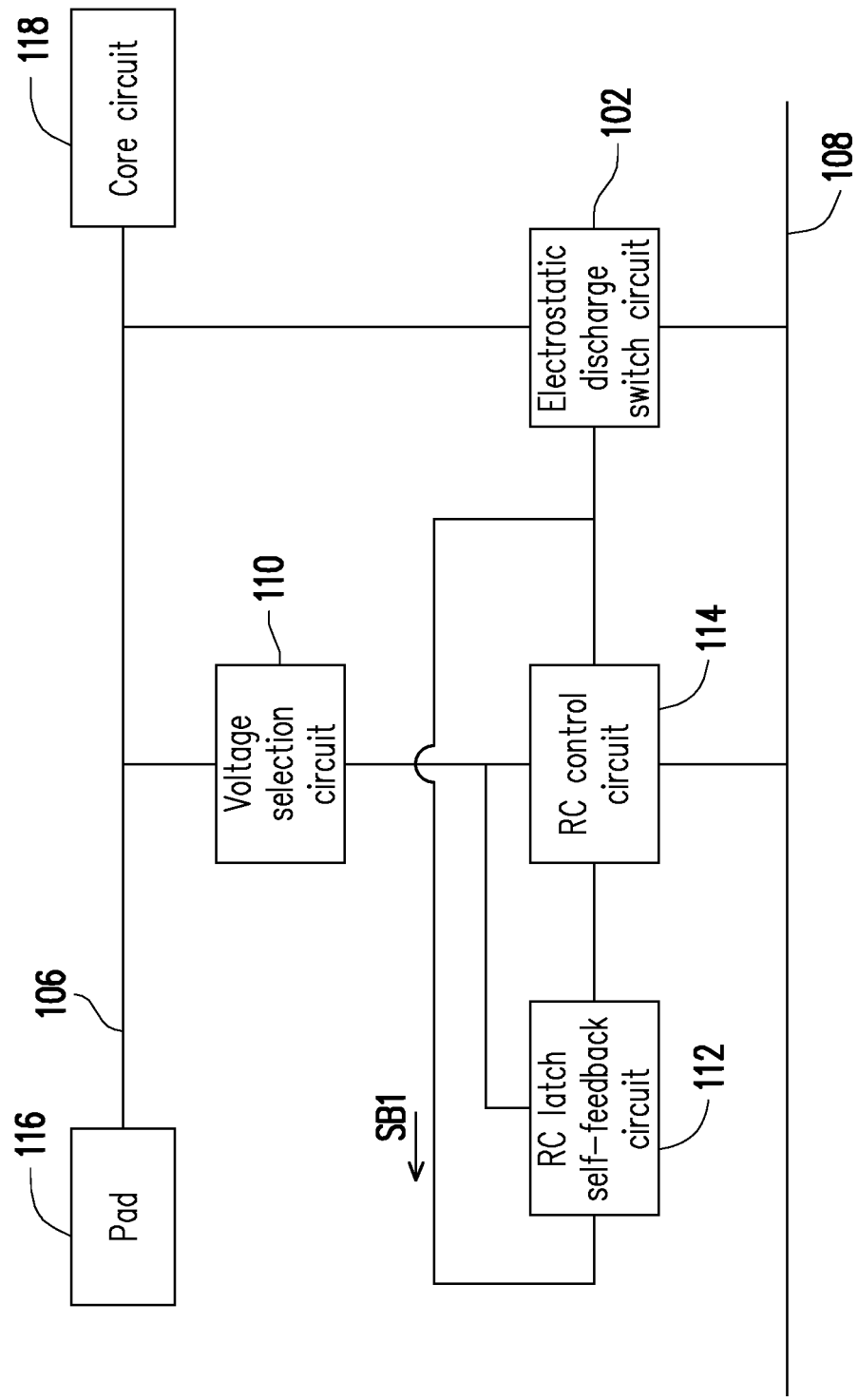
FIG. 1 is a schematic diagram illustrating an electrostatic discharge protection device according to an embodiment of the invention.

FIG. 1 is a schematic diagram illustrating an electrostatic discharge protection device according to an embodiment of the invention. An electrostatic discharge protection device of the present embodiment may include an electrostatic discharge switch circuit 102, a voltage selection circuit 110, an RC latch self-feedback circuit 112 and an RC control circuit 114. The electrostatic discharge switch circuit 102 may be coupled between a conductive path 106 and a conductive path 108. The conductive paths 106 and 108 may be, for example, a system voltage rail and a ground voltage rail, respectively. The electrostatic discharge switch circuit 102 may be configured to conduct an electrostatic current between the conductive path 106 and the conductive path 108 when the electrostatic discharge occurs. Additionally, the RC control circuit 114 may supply a bias voltage to a control terminal of the electrostatic discharge switch circuit 102 when the electrostatic discharge occurs, so as to turn on the electrostatic discharge switch circuit 102 for the conduction of the electrostatic current.

In the present embodiment, the conductive path 106 may be coupled between a pad 116 and a core circuit 118. The pad 116 may be used as, for example, a power supply pad or an input/output (I/O) pad. In addition, the voltage selection circuit 110 may be coupled to the conductive path 106, the RC latch self-feedback circuit 112 and the RC control circuit 114. The RC control circuit 114 may be further coupled to the RC latch self-feedback circuit 112, the conductive path 108 and the control terminal of the electrostatic discharge switch circuit 102. An input terminal of the voltage selection circuit 110 may receive a voltage from the conductive path 106 and select a voltage having a higher voltage value from the reference voltage and the voltage from the conductive path 106 to serve it as a selected output voltage and supply it to the RC latch self-feedback circuit 112 and the RC control circuit 114, such that the RC latch self-feedback circuit 112 may generate a control signal to the RC control circuit 114 according to the selected output voltage and a feedback signal SB1 provided by an output terminal of the RC control circuit 114 when the electrostatic discharge does not occur, so as to latch a voltage of an input terminal of the RC control circuit 114 and disconnect a discharge path of the electrostatic discharge switch circuit 102. In this way, it may be ensured that the discharge path of the electrostatic discharge switch circuit 102 may be maintained in a disconnected state when the electrostatic discharge does not occur, without causing the electrostatic discharge switch circuit 102 to generate any leakage current due to fluctuations of input and output signals of the pad 116 that affects the transmission quality of data signals, and power loss may be reduced. In addition, the pad of the electrostatic discharge protection device may be used as the power supply pad or the I/O pad when the electrostatic discharge does not occur, which may achieve advantages of saving cost, satisfying a demand for reducing a circuit area and so on. In addition, when the electrostatic discharge occurs, the RC control circuit 114 may supply the bias voltage to the control terminal of the electrostatic discharge switch circuit 102 directly in response to the electrostatic current on the conductive path 106, so as to turn on the discharge path of the electrostatic discharge switch circuit 102 to achieve a purpose of electrostatic discharge protection.

Figure 2:
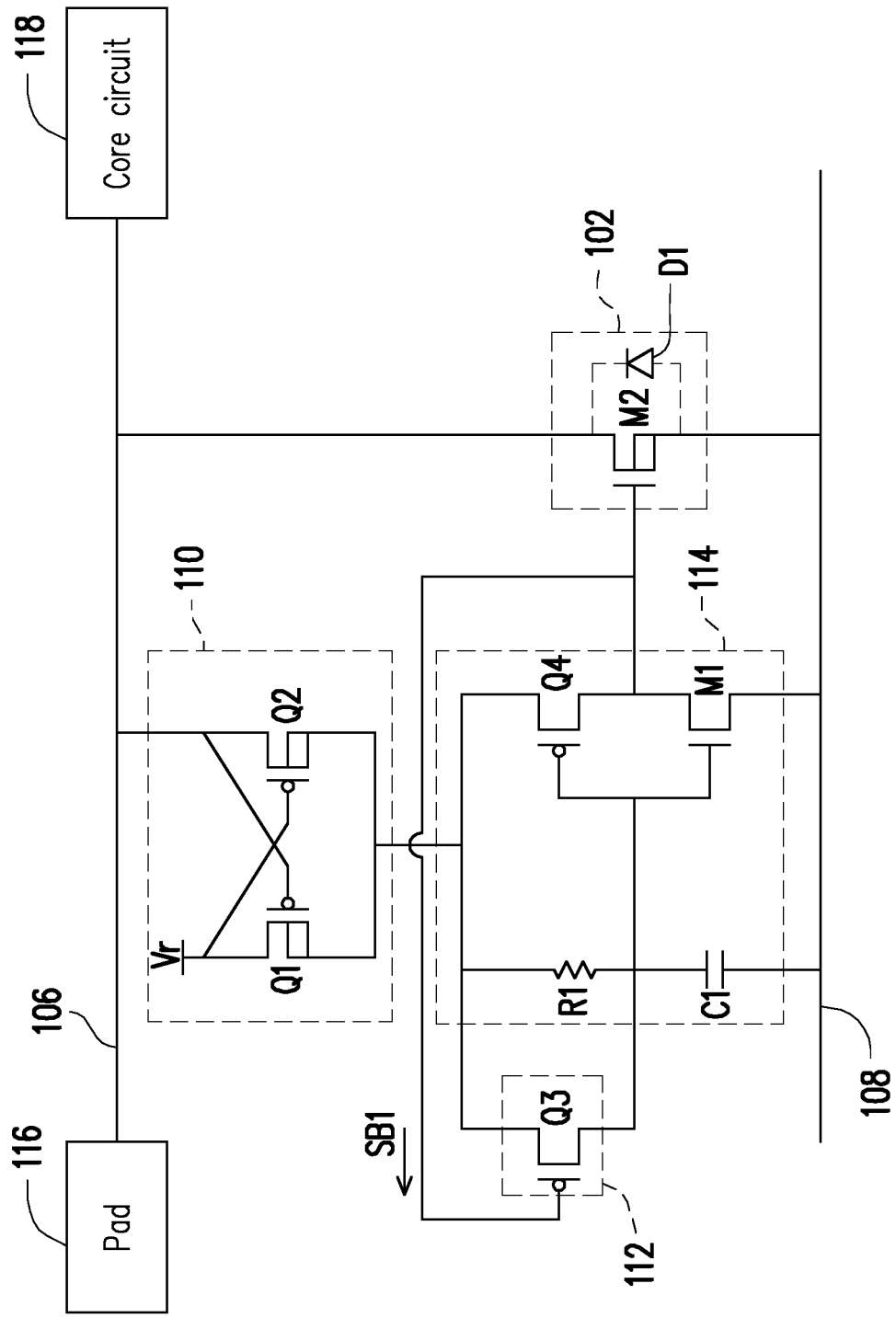
FIG. 2 is a schematic diagram illustrating an electrostatic discharge protection device according to another embodiment of the invention.

FIG. 2 is a schematic diagram illustrating an electrostatic discharge protection device according to an another embodiment of the invention. In detail, the electrostatic discharge protection device may be implemented in a manner same as that illustrated in FIG. 2. The electrostatic discharge switch circuit 102 may be implemented by an N-type metal oxide semiconductor (NMOS) transistor M2, a base terminal and a source terminal of the NMOS transistor M2 may be coupled to each other, and a parasitic diode D1 may be formed between the base terminal and the source terminal of the NMOS transistor M2. The voltage selection circuit 110 may include, for example, PMOS transistors Q1 and Q2. A source terminal of the PMOS transistor Q1 may be coupled to a reference voltage Vr, a gate terminal of the PMOS transistor Q1 may be coupled to the conductive path 106, and a drain terminal and a base terminal of the PMOS transistor Q1 may be coupled to each other. A source terminal and a gate terminal of the PMOS transistor Q2 may be respectively coupled to the gate terminal and the source terminal of the PMOS transistor Q1, and a drain terminal of the PMOS transistor Q2 in common with the drain terminal of the PMOS transistor Q1 may be coupled to an output terminal of the voltage selection circuit 110. The RC latch self-feedback circuit 112 may include, for example, a switch (which may be implemented by a P-type metal oxide semiconductor (PMOS) transistor Q3 in the present embodiment, but the invention is not limited thereto).

The RC control circuit 114 may include a resistor R1, a capacitor C1 and an inverter circuit composed of a PMOS transistor Q4 and an NMOS transistor M1. The PMOS transistor Q3 may be coupled between the voltage selection circuit 110 and the input terminal of the RC control circuit 114, and a gate terminal of the PMOS transistor Q3 may be coupled to the output terminal of the RC control circuit 114. A first terminal of the resistor R1 may be coupled to the output terminal of the voltage selection circuit 110, and a second terminal of the resistor R1 may be coupled to the input terminal of the RC control circuit 114. A first terminal of the capacitor C1 may be coupled to the second terminal of the resistor R1, and a second terminal of the capacitor C1 may be coupled to the conductive path 108. The PMOS transistor Q4 and the NMOS transistor M1 may be coupled between the output terminal of the voltage selection circuit 110 and the conductive path 108. A gate terminal of the PMOS transistor Q4 and a gate terminal of the NMOS transistor M1 may be coupled to a drain terminal of the PMOS transistor Q3, a drain terminal of the PMOS transistor Q4 and a drain terminal of the NMOS transistor M1 may be coupled to the output terminal of the RC control circuit 114, the output terminal of the RC control circuit 114 may be coupled to a gate terminal of the NMOS transistor M2 and a gate terminal of the PMOS transistor Q3, such that a conductive state of the NMOS transistor M2 may be controlled, and the feedback signal SB1 may be provided to the gate terminal of the PMOS transistor Q3.

When the electrostatic discharge occurs, the PMOS transistor Q1 and the pad 116 may be in a floating state. In the case where the pad 116 exhibits a positive electrostatic discharge (ESD) pulse, the voltage selection circuit 110 composed of the PMOS transistors Q1 and Q2 may select to react the voltage on the conductive path 106 to its output terminal, and an instantaneous voltage of the output terminal of the voltage selection circuit 110 may cause a voltage at a common contact of the resistor R1 and the capacitor C1 to be a low voltage. This low voltage after being inverted by the inverter circuit composed of the PMOS transistor Q4 and the NMOS transistor M1 in the RC control circuit 114 may be supplied to the NMOS transistor M2 to turn on the NMOS transistor M2, such that the electrostatic current may be guided to the conductive path 108 to prevent the core circuit 118 from being damaged. In addition, after a period of time, the voltage at the common contact of the resistor R1 and the capacitor C1 may be converted from the low voltage into a high voltage due to the capacitor C1 being charged by static electricity with a positive pulse. This high voltage after being further inverted by the inverter circuit composed of the PMOS transistor Q4 and the NMOS transistor M1 may be converted into a low voltage, thereby causing the NMOS transistor M2 to enter a disconnected state. Further, in the case where the pad 116 exhibits a negative ESD pulse, the electrostatic current may be guided to flow to the pad 116 through the parasitic diode D1 between the base terminal and the drain terminal of the NMOS transistor M2, so as to prevent the core circuit 118 from being damaged.

Moreover, when the electrostatic discharge does not occur (e.g., the electrostatic discharge protection device is in an I/O mode), the voltage selection circuit 110 may select the higher of the voltage output from the reference voltage Vr and the voltage on the conductive path 106 for being output. In other words, the voltage output by the voltage selection circuit 110 may at least have a voltage value equal to that of the reference voltage Vr. When the voltage selection circuit 110 initially outputs the voltage, the voltage at the common contact of the resistor R1 and the capacitor C1 may be converted from a low voltage level into a high voltage level, the voltage (i.e., gate voltage of the NMOS transistor M2) of the output terminal of the RC control circuit 114 may be correspondingly converted from a high voltage level into a low voltage level, such that the NMOS transistor M2 is in the disconnected state. In addition, the gate voltage (i.e., the feedback signal SB1) of the NMOS transistor M2 may be fed back to the gate terminal of the PMOS transistor Q3. In other words, the voltage of the gate terminal of the PMOS transistor Q3 may be correspondingly converted from a high voltage level into a low voltage level to enter the conductive state, so as to supply the voltage (which is at least equal to the voltage value of the reference voltage Vr) from the output terminal of the voltage selection circuit 110 to the RC latch self-feedback circuit 112. In this way, the voltage of the input terminal of the RC control circuit 114 may be latched at the high voltage level, thereby ensuring that the NMOS transistor M2 may be maintained in an off state by the bias voltage supplied by the RC control circuit 114. Since the voltage selection circuit 110 may select the voltage having the higher voltage value from the reference voltage Vr and the voltage on the conductive path 106 and supply it to the RC latch self-feedback circuit 112, the voltage selection circuit 110, no matter how the input and the output signals of the pad 116 fluctuate, may be capable of supplying the voltage (which is at least equal to the voltage value of the reference voltage Vr) sufficient for maintaining the NMOS transistor M2 in the off state to the RC latch self-feedback circuit 112. Thereby, the transmission of the input and the output signals of the pad 116 may be prevented from being affected by the conduction of the NMOS transistor M2, and the power loss may be reduced.

Figure 3:
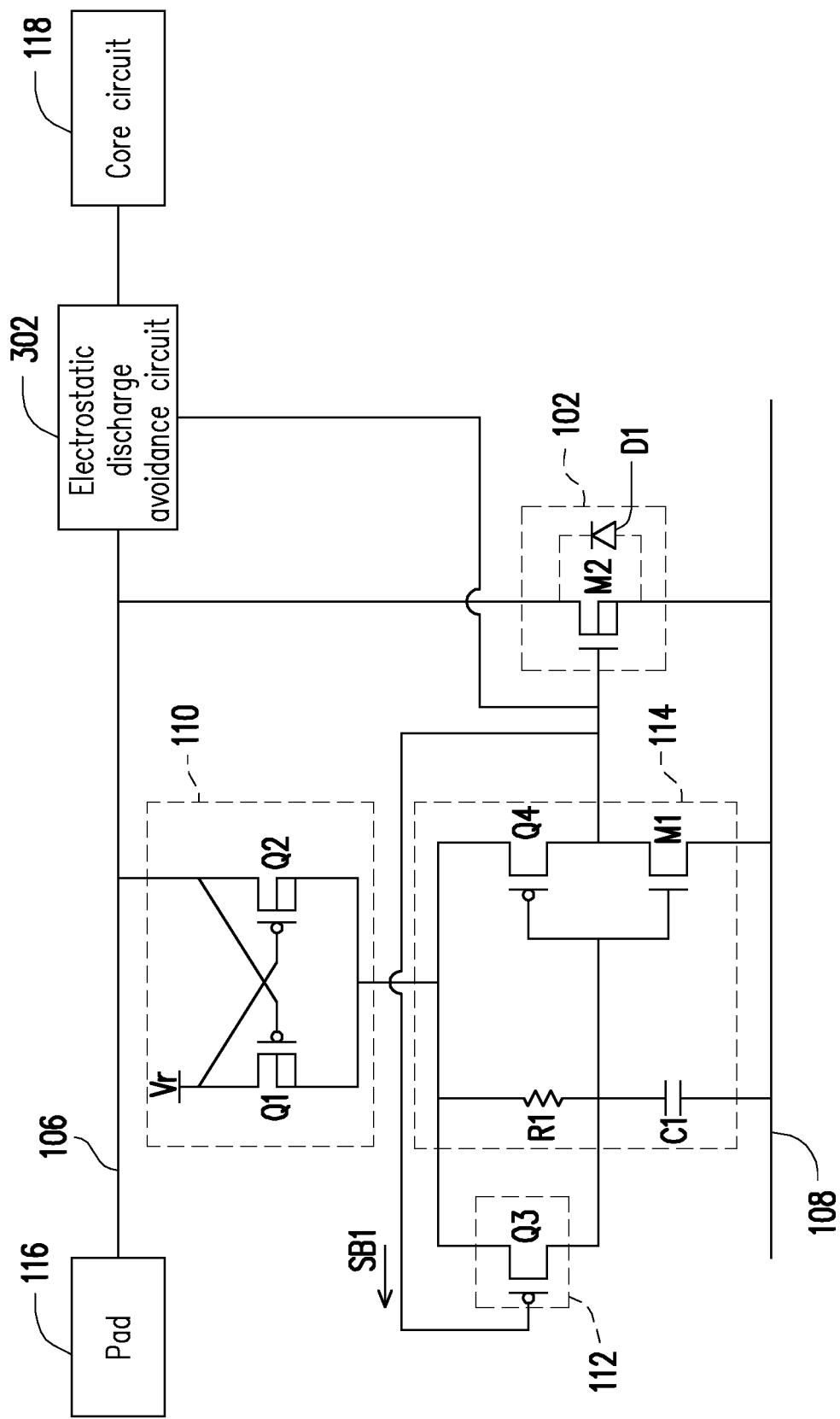
FIG. 3 is a schematic diagram illustrating an electrostatic discharge protection device according to another embodiment of the invention.

FIG. 3 is a schematic diagram illustrating an electrostatic discharge protection device according to an embodiment of the invention. An electrostatic discharge protection device of the present embodiment is different from the electrostatic discharge protection device of the embodiment illustrated in FIG. 2 in the electrostatic discharge protection device of the present embodiment further including an electrostatic discharge avoidance circuit 302 coupled between the conductive path 106 and the core circuit 118 and coupled to the output terminal of the RC control circuit 114. The electrostatic discharge avoidance circuit 302 may be controlled by the bias voltage supplied by the RC control circuit 114 to disconnect the conductive path 106 from the core circuit 118 when the electrostatic discharge occurs, thereby further preventing the core circuit 118 from being damaged by the electrostatic current. The electrostatic discharge avoidance circuit 302 may include, for example, a PMOS transistor switch, and a gate terminal of the PMOS transistor switch is coupled to the control terminal of the electrostatic discharge switch circuit 102.

Figure 4:
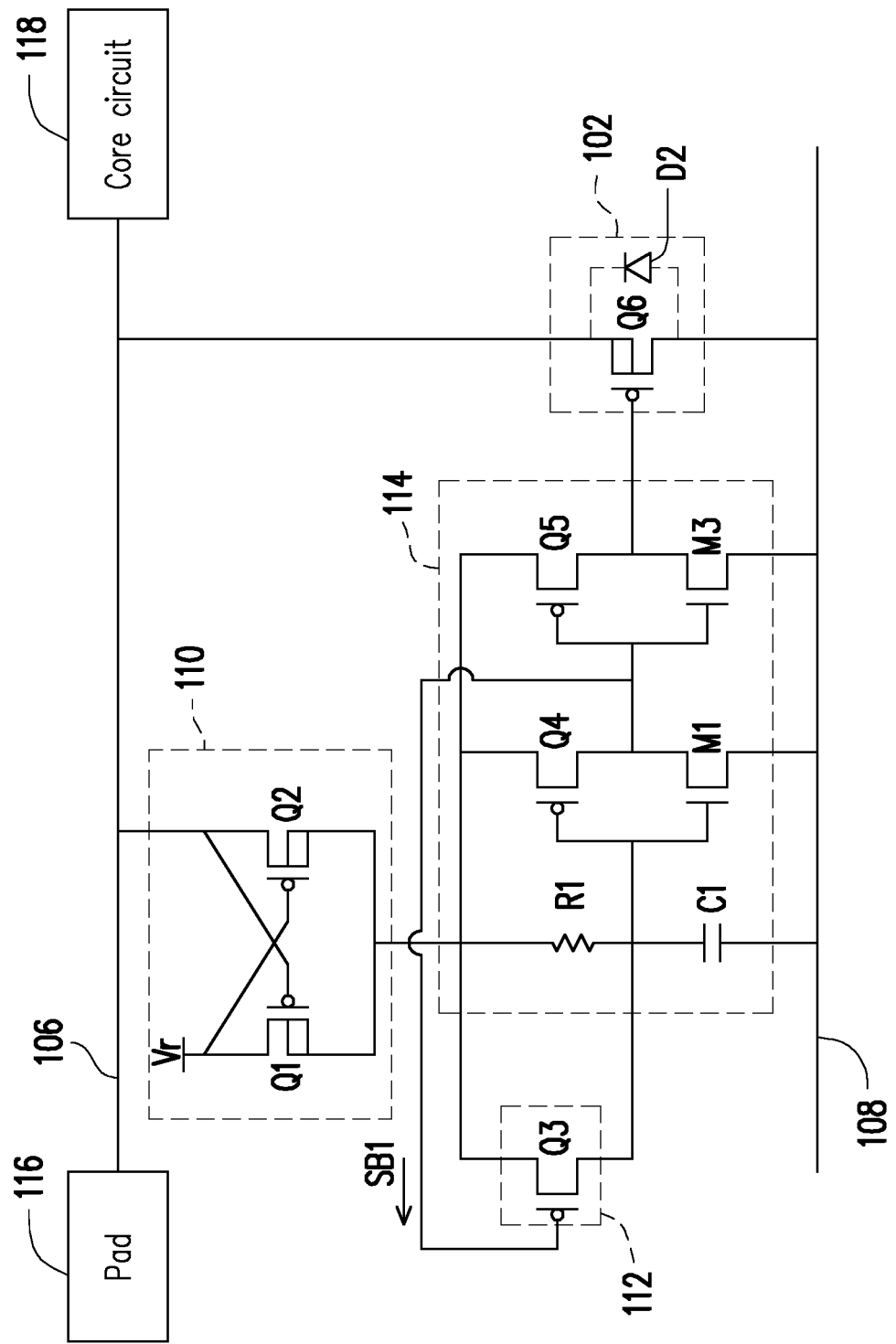
FIG. 4 is a schematic diagram illustrating an electrostatic discharge protection device according to another embodiment of the invention.

FIG. 4 is a schematic diagram illustrating an electrostatic discharge protection device according to another embodiment of the invention. The electrostatic discharge protection device of the present embodiment is different from the electrostatic discharge protection device of the embodiment illustrated in FIG. 2 in that the RC control circuit 114 of the present embodiment may further include more inverter circuits. For example, referring to FIG. 4, the RC control circuit 114 may further include an inverter circuit composed of a PMOS transistor Q5 and an NMOS transistor M3, and the inverter circuit composed of the PMOS transistor Q5 and the NMOS transistor M3 may be configured to control the conductive state of the discharge path of the electrostatic discharge switch circuit 102. It should be noted that in the scenario where the RC control circuit 114 includes an even number of inverter circuits, the implementation manner of the electrostatic discharge switch circuit 102 may have to be correspondingly changed, for example, the electrostatic discharge switch circuit 102 illustrated in FIG. 4 may be implemented by a PMOS transistor Q6 having a control terminal coupled to a common contact of the PMOS transistor Q5 and the NMOS transistor M3. A base terminal and a source terminal of the PMOS transistor Q6 may be coupled to each other, and a parasitic diode D2 may be formed between the base terminal and the source terminal of the PMOS transistor Q6. The parasitic diode D2 may be configured to guide the negative ESD pulse, thereby preventing the core circuit 118 from being damaged.

In addition, the feedback signal SB1 may be still supplied by the inverter circuit composed of the PMOS transistor Q4 and the NMOS transistor M1. Thus, operations of the voltage selection circuit 110, the RC latch self-feedback circuit 112 and the RC control circuit 114 are similar to those of the embodiments described above. Additionally, in the present embodiment, the inverter circuit compose of the PMOS transistor Q5 and the NMOS transistor M3 may cause the signal provided to the electrostatic discharge switch circuit 102 by the RC control circuit 114 to be inverted to that of the embodiment illustrated in FIG. 2. However, the electrostatic discharge switch circuit 102 of the present embodiment may change to be implemented by the PMOS transistor Q6 corresponding to such situation. Thus, the operation between the RC control circuit 114 and the electrostatic discharge switch circuit 102 of the present embodiment is similar to the embodiments described above. Therefore, people with ordinary skills in the art may derive the operation of the electrostatic discharge protection device of the invention according to the embodiments described above, and details related thereto will not be repeatedly described hereinafter.

Figure 5:
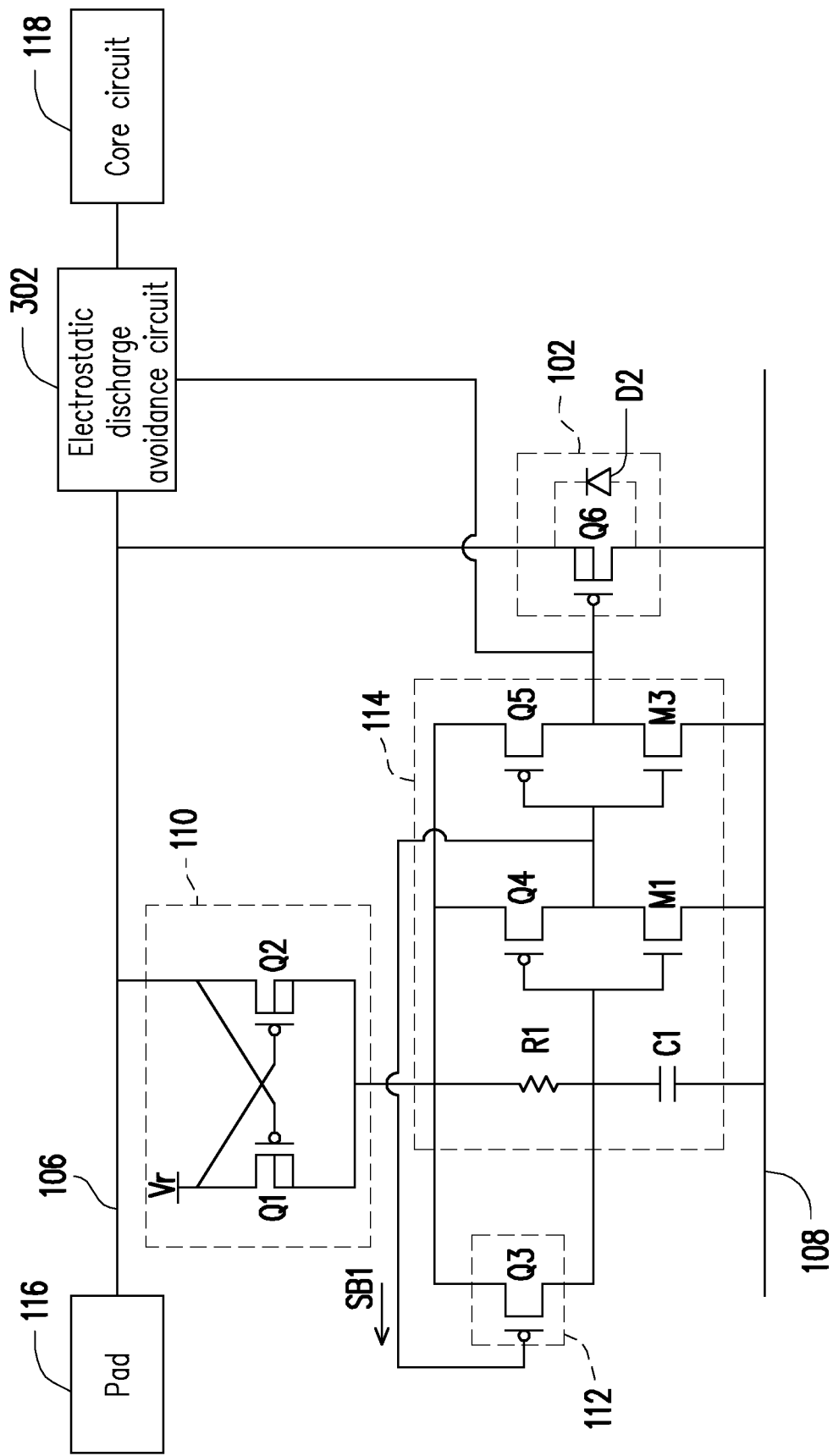
FIG. 5 is a schematic diagram illustrating an electrostatic discharge protection device according to another embodiment of the invention.

FIG. 5 is a schematic diagram illustrating an electrostatic discharge protection device according to another embodiment of the invention. An electrostatic discharge protection device of the present embodiment is different from the electrostatic discharge protection device of the embodiment illustrated in FIG. 4 in the electrostatic discharge protection device of the present embodiment further including an electrostatic discharge avoidance circuit 302. Similarly, the electrostatic discharge avoidance circuit 302 may be controlled by the bias voltage supplied by the RC control circuit 114 in the present embodiment to disconnect the conductive path 106 from the core circuit 118 when the electrostatic discharge occurs, so as to prevent the core circuit 118 from being damaged by the electrostatic current. It should be noted that the signal provided to the electrostatic discharge switch circuit 102 by the RC control circuit 114 of the present embodiment is inverted to the signal of the embodiment illustrated in FIG. 2. Thus, the electrostatic discharge avoidance circuit 302 of the present embodiment may change to be implemented by, for example, an NMOS transistor switch having a gate coupled to the control terminal of the electrostatic discharge switch circuit 102. It is noted that, when the electrostatic discharge avoidance circuit 302 is implemented by PMOS transistor switch in the embodiment of FIG. 5, the gate of the PMOS transistor switch is connected to the common node of the PMOS transistor Q4 and the NMOS transistor M1.

In view of the foregoing, in the embodiments of the invention, the voltage selection circuit selects the voltage having the higher voltage value from the reference voltage and the voltage on the first conductive path and supplies it to the RC latch self-feedback circuit. Thereby, the RC latch self-feedback circuit can latch the voltage of the input terminal of the RC control circuit when the electrostatic discharge does not occur, so as to disconnect the switch that conducts the electrostatic current to reduce the power loss and prevent the signal loss. Thus, the pad of the electrostatic discharge protection device can be used as the power supply pad or the I/O pad when the electrostatic discharge does not occur, so as to achieve advantages of saving cost, satisfying the demand for reducing the circuit area, without the occurrence of the issues of excessively high power loss and poor transmission of data signals.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. An electrostatic discharge protection device, comprising:

an electrostatic discharge switch circuit, coupled between a first conductive path and a second conductive path, wherein the first conductive path is coupled to a pad, and an electrostatic current is conducted between the first conductive path and the second conductive path when an electrostatic discharge occurs;

a voltage selection circuit, having an input terminal coupled to the first conductive path and selecting a voltage having a higher voltage value from a reference voltage and a voltage on the first conductive path to output the higher voltage value as a selected output voltage;

a resistance-capacitance (RC) control circuit, coupled to an output terminal of the voltage selection circuit, the second conductive path and the electrostatic discharge switch circuit, and supplying a bias voltage to a control terminal of the electrostatic discharge switch circuit in response to the electrostatic current on the first conductive path when the electrostatic discharge occurs, so as to turn on a discharge path of the electrostatic discharge switch circuit; and an RC latch self-feedback circuit, coupled to the output terminal of the voltage selection circuit and the RC control circuit, and generating a control signal to an input terminal of the RC control circuit according to the selected output voltage and a feedback signal provided by an output terminal of the RC control circuit when the electrostatic discharge does not occur, so as to latch a voltage of the input ten final of the RC control circuit and disconnect the discharge path of the electrostatic discharge switch circuit.

2. The electrostatic discharge protection device according to claim 1, wherein the RC latch self-feedback circuit comprises:
   a switch, coupled between the voltage selection circuit and the RC control circuit, and having a control terminal coupled to the output terminal of the RC control circuit to receive the feedback signal.

3. The electrostatic discharge protection device according to claim 2, wherein the electrostatic discharge switch circuit comprises an N-type metal oxide semiconductor (NMOS) transistor, and the switch comprises a P-type metal oxide semiconductor (PMOS) transistor.

4. The electrostatic discharge protection device according to claim 3, wherein a source terminal and a base terminal of the NMOS transistor are coupled to each other.

5. The electrostatic discharge protection device according to claim 2, wherein the electrostatic discharge switch circuit comprises a PMOS transistor, and the switch comprises a PMOS transistor.

6. The electrostatic discharge protection device according to claim 5, wherein a source terminal and a base terminal of the PMOS transistor comprised in the electrostatic discharge switch circuit are coupled to each other.

7. The electrostatic discharge protection device according to claim 1, wherein the voltage selection circuit comprises:
   a first PMOS transistor, having a source terminal coupled to the reference voltage, a gate terminal coupled to the first conductive path, and a drain terminal and a base terminal coupled to each other; and
   a second PMOS transistor, having a source terminal and a gate terminal respectively coupled to the gate terminal and the source terminal of the first PMOS transistor, and a drain terminal in common with the drain terminal of the first PMOS transistor coupled to the output terminal of the voltage selection.

8. The electrostatic discharge protection device according to claim 1, wherein RC control circuit comprises:
   an inverter circuit, having an input terminal and an output terminal respectively coupled to an output terminal and an input terminal of the RC latch self-feedback circuit to provide the feedback signal;
   a resistor, having a first terminal coupled to the output terminal of the voltage selection circuit, and a second terminal coupled to the input terminal of the inverter circuit; and
   a capacitor, having a first terminal coupled to the second terminal of the resistor, and a second terminal coupled to the second conductive path.

9. The electrostatic discharge protection device according to claim 1, further comprising:
   an electrostatic discharge avoidance circuit, coupled between the first conductive path and a core circuit, coupled to the output terminal of the RC control circuit, and controlled by the bias voltage to disconnect the first conductive path from the core circuit when the electrostatic discharge occurs.

10. The electrostatic discharge protection device according to claim 1, wherein the first conductive path is a system voltage rail.

11. The electrostatic discharge protection device according to claim 1, wherein the second conductive path is a ground voltage rail.

* * * * *